(12) United States Patent
Wang et al.

(10) Patent No.: US 9,202,693 B2
(45) Date of Patent: Dec. 1, 2015

(54) FABRICATION OF ULTRA-SHALLOW JUNCTIONS

(71) Applicant: Taiwan Semiconductor Manufacturing Co., Ltd., Hsin-Chu (TW)

(72) Inventors: Li-Ting Wang, Tainan (TW);
Chun-Feng Nieh, Hsinchu (TW);
Chong-Wai Lo, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/751,188

(22) Filed: Jan. 28, 2013

(65) Prior Publication Data

US 2014/0213047 A1 Jul. 31, 2014

(51) Int. Cl.
*H01L 21/20* (2006.01)
*H01L 21/02* (2006.01)
*H01L 21/265* (2006.01)
*H01L 21/22* (2006.01)
*H01L 21/8234* (2006.01)
(Continued)

(52) U.S. Cl.
CPC .... *H01L 21/26506* (2013.01); *H01L 21/02532* (2013.01); *H01L 21/2022* (2013.01); *H01L 21/2253* (2013.01); *H01L 21/26513* (2013.01); *H01L 21/823418* (2013.01); *H01L 29/66568* (2013.01); *H01L 21/02381* (2013.01); *H01L 21/823814* (2013.01)

(58) Field of Classification Search
CPC ............ H01L 21/26506; H01L 21/324; H01L 21/823418; H01L 21/26513; H01L 21/2253

USPC ......................................................... 438/511
See application file for complete search history.

(56) References Cited

U.S. PATENT DOCUMENTS 6,495,887 B1 * 12/2002 Krishnan et al. .............. 257/347
7,736,968 B2    6/2010 Ku et al.
(Continued)

FOREIGN PATENT DOCUMENTS

CN      101728274 A     6/2010
TW      200816328 A     4/2008

OTHER PUBLICATIONS

"Defect Engineering in the Formation of Ultra-Shallow Junctions for Advanced Nano-Metal-Oxide-Semiconductor Technology"; Hooi, Yeong Sai; Accessed Oct. 1, 2014; Published On-Line by SholarBank on Jan. 31, 2011; Pertinent p. 191; <http://scholarbank.nus.edu.sg/handle/10635/19033>.*

(Continued)

*Primary Examiner* — Victor A Mandala
*Assistant Examiner* — Regan J Rundio
(74) *Attorney, Agent, or Firm* — Duane Morris LLP

(57) ABSTRACT

A method of forming an ultra-shallow junction in a semiconductor substrate. The method includes forming an amorphous region in a semiconductor substrate by performing a pre-amorphization implant step and implanting one or more dopants in the amorphous region by performing a monolayer doping step. The semiconductor substrate is then thermally treated to activate the implanted dopant in the amorphous region to thereby form an ultra-shallow junction in the semiconductor substrate. The thermal treatment can be performed without any oxide cap overlying the implanted amorphous region.

17 Claims, 4 Drawing Sheets

(51) Int. Cl.
*H01L 21/225* (2006.01)
*H01L 29/66* (2006.01)
*H01L 21/8238* (2006.01)

(56) References Cited

U.S. PATENT DOCUMENTS

| | | | |
|---|---|---|---|
| 8,207,030 B2* | 6/2012 | Brunco et al. | 438/199 |
| 2002/0089032 A1* | 7/2002 | Huang | 257/507 |
| 2006/0073643 A1* | 4/2006 | Li | 438/142 |
| 2008/0023732 A1* | 1/2008 | Felch et al. | 257/288 |
| 2008/0188043 A1* | 8/2008 | Ishitsuka et al. | 438/198 |
| 2008/0286929 A1* | 11/2008 | Miyashita | 438/278 |
| 2009/0050980 A1* | 2/2009 | Ekbote et al. | 257/408 |
| 2010/0048005 A1* | 2/2010 | Seebauer | 438/530 |
| 2010/0065924 A1* | 3/2010 | Lin et al. | 257/408 |
| 2010/0105185 A1* | 4/2010 | Ku et al. | 438/301 |
| 2010/0133624 A1* | 6/2010 | Nandakumar et al. | 257/369 |
| 2012/0252197 A1* | 10/2012 | Clark | 438/559 |

OTHER PUBLICATIONS

Official Action issued Apr. 22, 2015 in counterpart Taiwan Patent Application.

* cited by examiner

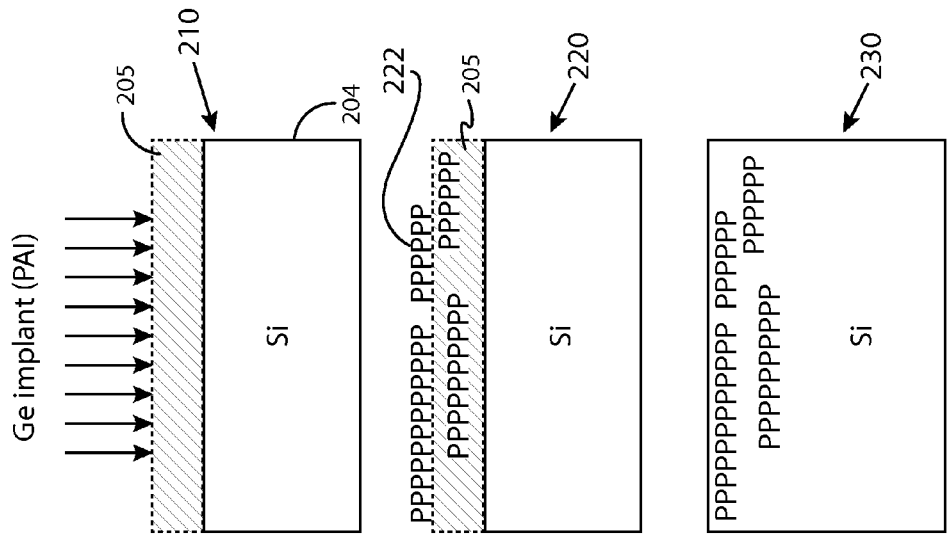
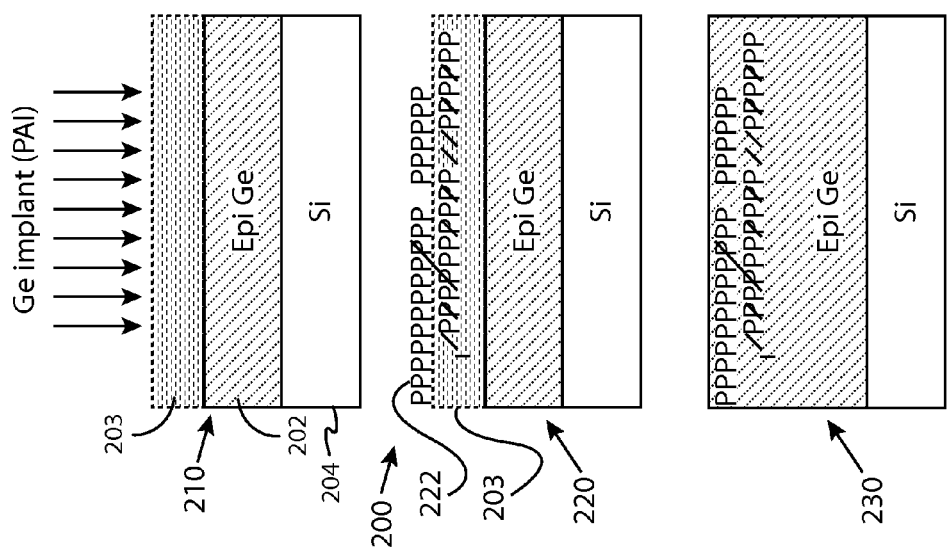
FIG. 2B
FIG. 2A

FABRICATION OF ULTRA-SHALLOW JUNCTIONS

BACKGROUND

Integrated circuits (ICs) having a plurality of semiconductor devices including field effect transistors (FETs) are a cornerstone of modern microelectronic systems. Conventionally, the various regions of FETs (e.g., source/drain and source/drain extensions) are formed by introducing dopant atoms into a semiconductor substrate using methods such as ion implantation, etc. After the dopants have been introduced, they are electrically activated by subjecting the semiconductor substrate to one or more annealing processes such as low temperature thermal annealing, rapid thermal annealing, spike annealing, flash annealing or laser annealing.

Dopants, however, have a tendency to diffuse or expand both laterally and vertically away from the profile during annealing thereby increasing the dimensions of the various device regions. This diffusion of dopants is undesirable particularly as semiconductor devices are scaled down in size. Scaling device dimensions down to the molecular regime thus presents a fundamental and technological challenge for fabricating well defined structures with controlled atomic composition.

One proposed route for achieving fine control of structural composition is the integration of self-limiting and self-assembly processes where surface and chemical phenomena guide the synthesis and fabrication of the desired nanostructures. There is a need for technology to demonstrate reliable nanoscale doping of silicon structures, e.g., for well-defined and uniformly doped ultra-shallow junctions at the source and drain extension regions. Conventional ion implantation processes which rely on bombardment of semiconductors with energetic ions suffer from an inability to achieve an implantation range and abruptness down to the nanometer range, a stochastic spatial distribution of the implanted ions, an incompatibility with nanostructured materials, and crystal damage. Solid-source diffusion processes lack the desired uniformity and control over the areal dose of the dopants to be used for miniaturized device fabrication. Monolayer doping (MLD), however, can attain a controlled doping of semiconductor materials with atomic accuracy. Generally, MLD utilizes the crystalline nature of semiconductors to form highly uniform, self-assembled, covalently bonded dopant-containing monolayers followed by a subsequent annealing step for the incorporation and diffusion of dopants.

Exemplary monolayer formation reactions are self-limiting and result in a deterministic coverage of dopant atoms on the semiconductor surface. MLD differs from other conventional doping techniques by method of dopant dose control. For example, as compared to ion-implantation, MLD does not involve a highly energetic introduction of dopant species into the semiconductor lattice where crystal damages are induced. To prevent dopant loss, however, conventional MLD techniques require an oxide cap layer to protect respective dopants during subsequent thermal processes. Thus, there is a need to provide or fabricate ultra-shallow junctions without depositing and/or removing such an oxide cap.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

FIGS. 2A and 2B are diagrams of additional techniques of fabricating an ultra-shallow junction using monolayer doping according to some embodiments of the present disclosure.

DETAILED DESCRIPTION

Figure 1:
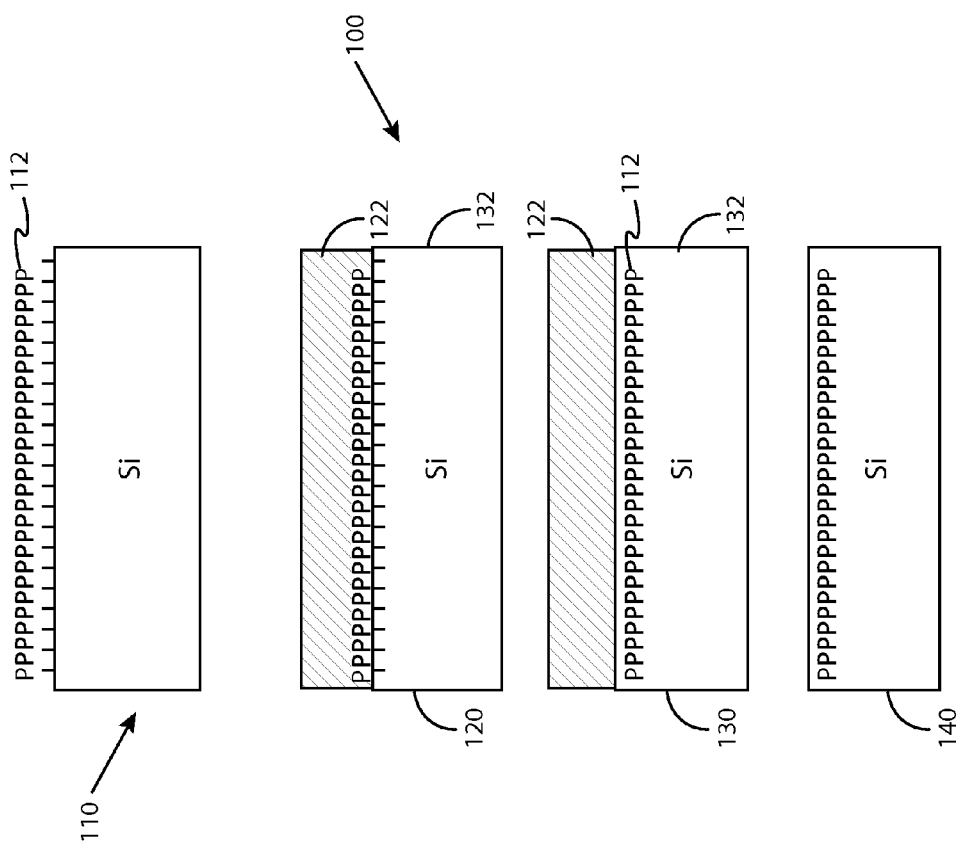
FIG. 1 is a diagram of one technique of fabricating an ultra-shallow junction using monolayer doping.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below".

FIG. 1 is a diagram of one technique of fabricating an ultra-shallow junction using monolayer doping (MLD). With reference to FIG. 1, an exemplary ultra-shallow junction fabrication technique 100 using MLD is illustrated where a monolayer of dopants 112 is assembled on the surface of a silicon structure when the substrate is exposed to a dopant-containing precursor in step 110. While not shown, a native silicon oxide layer is generally first removed by hydrofluoric (HF) etching prior to the reaction of the substrate with the dopant-containing precursor. Exemplary dopants can include, but are not limited to, boron, aluminum, gallium, indium, thallium, nitrogen, phosphorous, arsenic, antimony, and bismuth, to name a few. In step 120, an oxide cap 122 comprising silicon dioxide ($SiO_2$), silicon oxynitride (SiON) or another barrier material is deposited on the monolayer to prevent dopant loss during subsequent thermal treatments, e.g., from outgassing of the dopant during annealing. This oxide cap or layer 122 can be deposited by chemical vapor deposition, electron beam evaporation or another suitable deposition technique and then selectively etched. In step 130, the structure undergoes thermal treatment to break down the dopant molecules resulting in a thermal diffusion of dopant atoms 112 into the substrate 132 to form an ultra-shallow junction. Exemplary thermal treatments include, but are not limited to, low temperature thermal annealing, rapid thermal annealing, spike annealing, flash annealing or laser annealing. In step 140, the oxide cap is removed by conventional methods such as HF etching.

FIGS. 2A and 2B are diagrams of additional techniques of fabricating an ultra-shallow junction using monolayer doping according to some embodiments of the present disclosure. With reference to FIG. 2A, an exemplary ultra-shallow junction fabrication technique 200 using MLD is illustrated where a pre-amorphization implant (PAI) step 210 is performed on an epitaxial germanium layer 202 overlying a silicon substrate 204. In FIG. 2B, the PAI step 210 is performed on the silicon substrate 204. The PAI step can be performed using any desired dopant, dose and/or energy. Dose and energy can be selected according to requirements for the structure to be formed, in particular to the depth of the desired amorphous layer. Non-limiting examples of dopants that can be used for PAI are germanium, nitrogen, indium, arsenic, boron, carbon, xenon, antimony, and argon, to name a few. Further, the choice of dopants can be dependent upon the semiconductor material used for the respective substrate. Thus, an exemplary PAI step 210 can assist in the activation of subsequent introduced dopants due to the amorphous nature of the structure surface and its respective affinity for subsequent doping. For example, PAI can be used to form implantation regions which are amorphous silicon provided below a top surface of the respective structure. In the case depicted in FIG. 2A, an amorphous region 203 is formed in the epitaxial germanium layer 202. In the case depicted in FIG. 2B, an amorphous region 205 is formed in the silicon substrate 204. The depth of such an amorphization region or layer is dependent upon dose and energy as noted above and can be between 10-15 nm below the top surface of the structure. In some embodiments, the depth of such an amorphization region or layer should be deeper than the peak concentration of activated dopants to ensure that any activated dopants are covered inside the PAI region.

At step 220, an exemplary MLD technique is used where a monolayer of dopants 222 is assembled on the surface of a respective structure when exposed to a dopant-containing precursor. Exemplary MLD techniques are applicable for both p- and n-doping of various nanostructured materials that are fabricated by either 'bottom-up' or 'top-down' approaches, making it highly versatile for various applications. An important characteristic of an MLD technique is that it employs self-limiting reactions to form a highly uniform monolayer on a crystalline germanium or silicon surface, resulting in a well-defined layer of chemically attached dopant-containing molecules with molecular accuracy. This is important for a well-controlled and uniform formation of the nanoscale doping profiles in subsequent thermal processes. The areal dopant dose can also be tuned by the molecular footprint of the respective precursor, with smaller molecules enabling a higher dose. The thermal process time and temperature can also be used to govern the precise nature of the junction depth. As a result, the combination of subsequent thermal process conditions and the molecular design of the precursor can provide a wide spectrum of doping profiles to meet the specific needs of the desired application or resulting structure. Exemplary dopants can include, but are not limited to, boron, aluminum, gallium, indium, thallium, nitrogen, carbon, fluorine, phosphorous, arsenic, antimony, and bismuth, to name a few. In the case depicted in FIG. 2A, due to performance of the foregoing PAI step, a greater amount of dopant can be captured in the amorphous region 203 provided in the epitaxial germanium layer 202 in comparison to the method depicted in FIG. 1. In the case depicted in FIG. 2B, due to performance of the foregoing PAI step, a greater amount of dopant can be captured in the amorphous region 205 provided in the silicon substrate 204 in comparison to the method depicted in FIG. 1. While an MLD technique is depicted in FIGS. 2A and 2B, the claims appended herewith should not be so limited as any exemplary ion implantation step can be used in embodiments of the present disclosure. Further, the illustration of a single MLD step should not limit the scope of the claims appended herewith as multiple MLD processes or steps are envisioned to provide additional dopant implantations in exemplary structures. In step 230, the respective structure then undergoes a thermal treatment to break down the dopant molecules resulting in a thermal diffusion of dopant atoms into the structure to form an ultra-shallow junction. Exemplary thermal treatments include, but are not limited to, low temperature thermal annealing, rapid thermal annealing, spike annealing, flash annealing or laser annealing. During the thermal treatment step 230, solid-phase epitaxial re-growth of the amorphous region can occur as illustrated.

Figure 3:
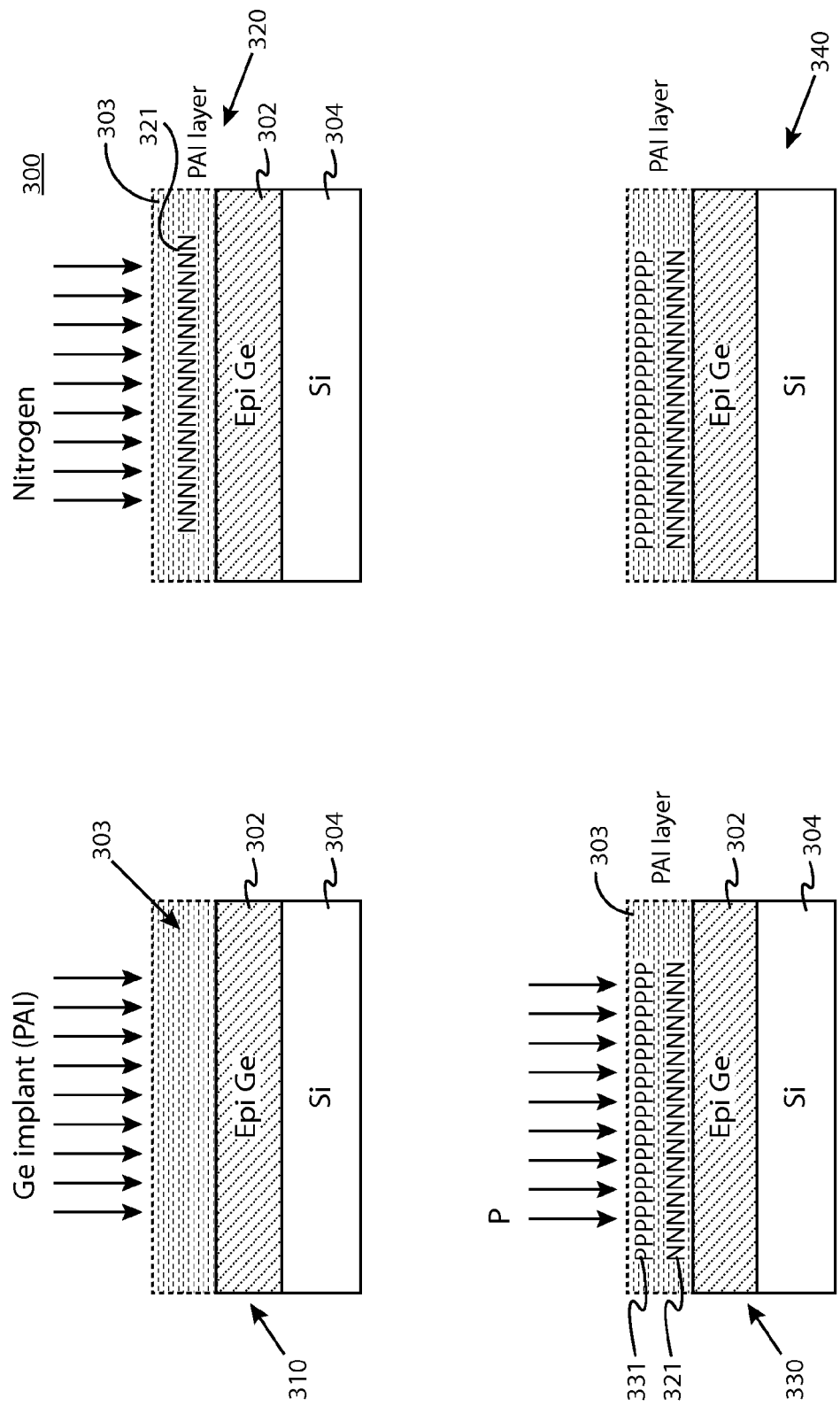
FIG. 3 is a diagram of an exemplary technique of fabricating an ultra-shallow junction according to some embodiments of the present disclosure.

FIG. 3 is a diagram of an exemplary technique of fabricating an ultra-shallow junction according to some embodiments of the present disclosure. With reference to FIG. 3, an exemplary ultra-shallow junction fabrication technique 300 is illustrated where a PAI step 310 is performed on an epitaxial germanium layer 302 overlying a silicon substrate 304 to form an amorphous region 303 in the epitaxial germanium layer 302. While an epitaxial germanium layer is illustrated, the PAI step 310 can be performed on any device or layer including a silicon substrate (not shown). The PAI step can be performed with a desired dopant, dose and/or energy. Dose and energy can be selected according to requirements for the structure to be formed, in particular to the depth thereof. Non-limiting examples of dopants that can be used for PAI are germanium, boron, carbon, nitrogen, indium, arsenic, xenon, antimony, and argon, to name a few. Further, the choice of dopants can be dependent upon the semiconductor material used for the respective substrate. An exemplary PAI step 310 can assist in the activation of subsequent introduced dopants. For example, PAI can be used to form implantation regions which are amorphous silicon provided below a top surface of the respective structure. The depth of such an amorphization is dependent upon dose and energy as noted above and can be between 10-15 nm below the top surface of the structure. In some embodiments, the depth of such an amorphization region or layer should be deeper than the peak concentration of activated dopants to ensure that any activated dopants are covered inside the PAI region.

At step 320, an exemplary ion implantation technique is used to assemble a layer of dopant on the surface of the structure. In the depicted example, a nitrogen implantation step can be performed using an implantation energy of 6 KeV resulting in a nitrogen implantation layer 321 having a depth of approximately 125 Angstroms. These values are exemplary only and should not limit the scope of the claims appended herewith as any suitable implantation energy can be employed to achieve a desirable implantation depth for a respective dopant. In some embodiments, an exemplary MLD technique is used where a monolayer of dopants is assembled on the surface of a respective structure when exposed to a dopant-containing precursor. Exemplary dopants can include, but are not limited to, boron, aluminum, gallium, indium, thallium, nitrogen, carbon, fluorine, phosphorous, arsenic, antimony, and bismuth, to name a few. In other embodiments, conventional ion implantation methods can be used in the place of MLD. At step 330, a second ion implantation technique is used to assemble a second layer of dopant on the surface of the structure. In the depicted example, a phosphorous implantation step is performed using an energy of 2 KeV resulting in a phosphorous implantation layer 331 having a shallower depth than the nitrogen implantation layer 321. Of course, this energy value is exemplary only and should not limit the scope of the claims appended herewith as any suitable implantation energy can be employed to achieve a desirable implantation depth for a respective dopant. It should be noted that due to performance of the foregoing PAI step 310, a greater amount of dopants (whether multiple or single dopants) can be captured in the amorphous region 303 formed in the epitaxial germanium layer 302. Generally, phosphorous diffuses in a germanium substrate. Thus, in some embodiments of the present disclosure, to suppress phosphorous diffusion in the structure a nitrogen co-implant can be introduced to achieve a high activation phosphorous source/drain extension (SDE) junction. Of course, other co-implants can be employed to suppress phosphorous diffusion, such as, but not limited to carbon co-implants, fluorine co-implants, and the like. In step 340, the respective structure then undergoes thermal treatment to break down the dopant molecules resulting in a thermal diffusion of dopant atoms into the structure to form an ultra-shallow junction. Exemplary thermal treatments include, but are not limited to, low temperature thermal annealing, rapid thermal annealing, spike annealing, flash annealing or laser annealing. During the thermal treatment step 340, solid-phase epitaxial re-growth of the amorphous region can occur.

Figure 4:
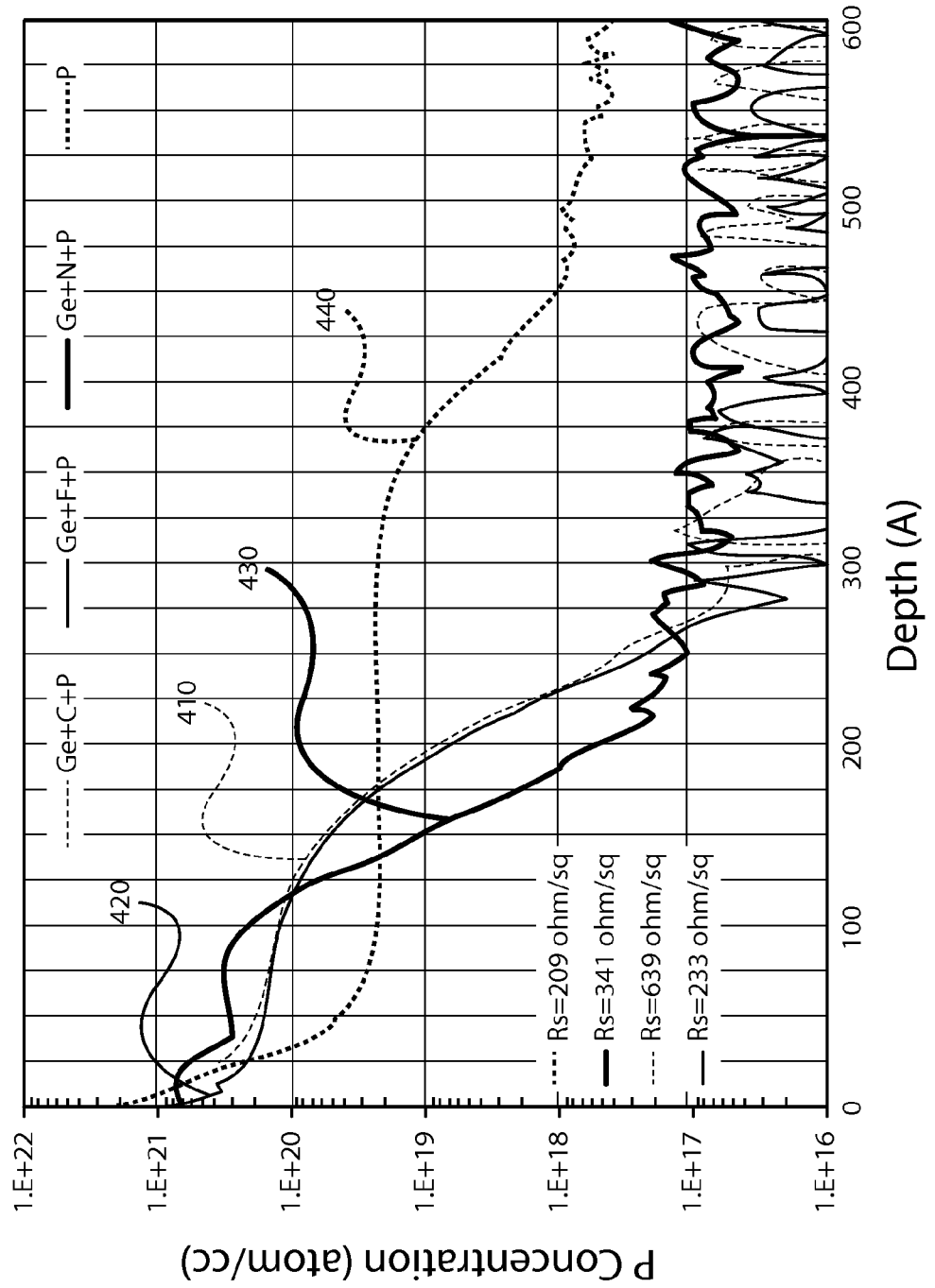
FIG. 4 is a graphical illustration of co-implantation methods according to embodiments of the present disclosure.

FIG. 4 is a graphical illustration of co-implantation methods according to embodiments of the present disclosure. With reference to FIG. 4, four traces are provided representing the concentration of phosphorous versus depth for a germanium substrate having a carbon co-implant followed by a phosphorous implant 410 with a sheet resistance of 639 ohm/sq, a germanium substrate having a fluorine co-implant followed by a phosphorous implant 420 with a sheet resistance of 233 ohm/sq, a germanium substrate having a nitrogen co-implant followed by a phosphorous implant 430 with a sheet resistance of 341 ohm/sq, and phosphorous 440 with a sheet resistance of 209 ohm/sq. As illustrated in FIG. 4, phosphorous concentration of the carbon and fluorine co-implants are maintained over depth better than the phosphorous sheet, the nitrogen co-implant provides a superior maintenance of phosphorous concentration over depth in comparison to the carbon and fluorine co-implants.

Thus, with reference to the aforementioned figures, various embodiments of the present disclosure can provide a method of forming an ultra-shallow junction in a semiconductor substrate. The method can include forming an amorphous region in a semiconductor substrate by performing a PAI step, implanting a dopant in the amorphous region by performing an MLD step, and thermally treating the semiconductor substrate to activate the implanted dopant in the amorphous region to thereby form an ultra-shallow junction in the semiconductor substrate. The dopant used for the PAI step can be, but is not limited to, germanium, boron, nitrogen, indium, arsenic, carbon, xenon, antimony, and argon. The implanted dopant used for the MLD step can be, but is not limited to, boron, aluminum, gallium, indium, thallium, nitrogen, carbon, fluorine, phosphorous, arsenic, antimony, and bismuth. Exemplary thermal treatments include low temperature thermal annealing, rapid thermal annealing, spike annealing, flash annealing or laser annealing step. In some embodiments of the present disclosure, the step of thermally treating is performed without any oxide cap overlying the implanted amorphous region.

Additional embodiments of the present disclosure provide a method of forming an ultra-shallow junction in a semiconductor substrate. The method can include forming an amorphous region in a semiconductor substrate by performing a PAI step, implanting a first dopant in the amorphous region by performing a first MLD step, implanting a second dopant in the amorphous region by performing a second MLD step, and thermally treating the semiconductor substrate to activate the implanted dopants in the amorphous region to thereby form an ultra-shallow junction in the semiconductor substrate. The dopant used for the PAI step can be, but is not limited to, germanium, boron, carbon, nitrogen, indium, arsenic, xenon, antimony, and argon. The implanted dopant used for the first MLD step can be, but is not limited to, boron, aluminum, gallium, indium, thallium, nitrogen, carbon, fluorine, phosphorous, arsenic, antimony, and bismuth. Exemplary thermal treatments include low temperature thermal annealing, rapid thermal annealing, spike annealing, flash annealing or laser annealing step. In some embodiments, the second implanted dopant is phosphorous and the first implanted dopant is nitrogen, fluorine or carbon. In other embodiments of the present disclosure, the step of thermally treating is performed without any oxide cap overlying the implanted amorphous region.

Further embodiments of the present disclosure provide a method of providing an ultra-shallow junction having activated dopants in a semiconductor substrate. The method includes forming an amorphous region in a semiconductor substrate, implanting a first dopant in the amorphous region by performing an MLD step, and activating the first dopant where the activating comprises recrystallizing the amorphous region and is performed without any oxide cap overlying the implanted amorphous region. In some embodiments, the step of forming an amorphous region comprises performing a PAI step. The dopant used for the PAI step can be, but is not limited to, germanium, nitrogen, indium, arsenic, boron, carbon, xenon, antimony, and argon. The implanted first dopant can be, but is not limited to, boron, aluminum, gallium, indium, thallium, nitrogen, carbon, fluorine, phosphorous, arsenic, antimony, and bismuth. Exemplary thermal treatments include low temperature thermal annealing, rapid thermal annealing, spike annealing, flash annealing or laser annealing step. In other embodiments, the method includes the step of implanting a second dopant in the amorphous region by performing a second MLD step, the second dopant being shallower than the first dopant, where the step of activating further comprises activating the first and second dopants. In various embodiments, the second dopant is phosphorous and the first dopant can be nitrogen, fluorine or carbon.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-4, various methods for fabrication of ultra-shallow junctions have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A method of forming an ultra-shallow junction in a semiconductor substrate comprising the steps of:
    providing a semiconductor substrate comprising silicon with an epitaxial layer of germanium thereon;
    forming an amorphous region in the epitaxial germanium layer by performing a pre-amorphization implant step;
    implanting nitrogen in the amorphous region by performing a first monolayer doping step;
    implanting phosphorous in the amorphous region by performing a second ion implantation after the first monolayer doping step; and
    thermally treating the semiconductor substrate to activate the implanted nitrogen and phosphorous in the amorphous region to thereby form an ultra-shallow junction in the semiconductor substrate.

2. The method of claim 1 wherein a dopant used for the pre-amorphization implant step is selected from the group consisting of germanium, boron, nitrogen, indium, arsenic, carbon, xenon, antimony, and argon.

3. The method of claim 1 wherein the step of thermally treating comprises performing a low temperature thermal annealing, rapid thermal annealing, spike annealing, flash annealing or laser annealing step.

4. The method of claim 1 wherein the step of thermally treating is performed without any oxide cap overlying the implanted amorphous region.

5. The method of claim 1, wherein a dopant used for the pre-amorphization implant step comprises germanium.

6. The method of claim 5, wherein the thermally treating comprises spike annealing.

7. The method of claim 6 wherein the step of thermally treating is performed without any oxide cap overlying the implanted amorphous region.

8. The method of claim 1 wherein:
    a dopant used for the pre-amorphization implant step is germanium,
    the step of thermally treating comprises performing a low temperature thermal annealing, rapid thermal annealing, spike annealing, flash annealing or laser annealing step, and
    the step of thermally treating is performed without any oxide cap overlying the implanted amorphous region.

9. The method of claim 8, wherein the amorphous region has a depth between 10 nm and 15 nm below a top surface of the epitaxial layer of germanium.

10. A method of providing an ultra-shallow junction having activated dopants in a semiconductor substrate comprising the steps of:
    providing a semiconductor substrate comprising silicon with an epitaxial layer of germanium thereon;
    forming an amorphous region in the epitaxial germanium layer;
    implanting nitrogen in the amorphous region by performing a first monolayer doping step; and
    implanting phosphorous in the amorphous region by performing a second ion implantation after the first monolayer doping step to form an implanted amorphous region;
    activating the nitrogen, wherein the activating comprises recrystallizing the implanted amorphous region,
    wherein the step of activating the nitrogen is performed without any oxide cap overlying the implanted amorphous region.

11. The method of claim 10 wherein the step of forming an amorphous region comprises performing a pre-amorphization implant step.

12. The method of claim 11 wherein a dopant used for the pre-amorphization implant step is selected from the group consisting of germanium, boron, carbon, nitrogen, indium, arsenic, xenon, antimony, and argon.

13. The method of claim 11 wherein a dopant used for the pre-amorphization implant step comprises germanium.

14. The method of claim 10 wherein the step of activating the nitrogen comprises performing a low temperature thermal annealing, rapid thermal annealing, spike annealing, flash annealing or laser annealing step.

15. The method of claim 10 wherein the phosphorus is shallower than the nitrogen, wherein the step of activating the nitrogen further comprises activating the phosphorus.

16. The method of claim 10, wherein the step of activating the nitrogen comprises spike annealing.

17. The method of claim 10 wherein:
    the amorphous region has a depth between 10 nm and 15 nm below a top surface of the epitaxial layer of germanium,
    a dopant used for the pre-amorphization implant step is germanium, and
    the step of activating the nitrogen comprises spike annealing.

* * * * *